(12) United States Patent
Katagiri

(10) Patent No.: US 9,704,609 B2
(45) Date of Patent: Jul. 11, 2017

(54) APPARATUS FOR REDUCING VOLUME OF RESIN CONTAINING RADIOACTIVE MATERIAL, AND METHOD FOR OPERATING THE APPARATUS

(75) Inventor: Gen-ichi Katagiri, Yokohama (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 13/984,334

(22) PCT Filed: Feb. 15, 2011

(86) PCT No.: PCT/JP2011/053142
§ 371 (c)(1),
(2), (4) Date: Aug. 8, 2013

(87) PCT Pub. No.: WO2012/111090
PCT Pub. Date: Aug. 23, 2012

(65) Prior Publication Data
US 2013/0313227 A1 Nov. 28, 2013

(51) Int. Cl.
*H01L 21/00* (2006.01)
*C23C 16/00* (2006.01)
(Continued)

(52) U.S. Cl.
CPC .............. *G21F 9/30* (2013.01); *G21F 9/308* (2013.01); *G21F 9/32* (2013.01); *H01J 37/3211* (2013.01);
(Continued)

(58) Field of Classification Search
CPC .............. H01J 37/321; H01J 37/3211; H01J 37/32119; H01J 37/32128;
(Continued)

(56) References Cited

U.S. PATENT DOCUMENTS 5,710,486 A 1/1998 Ye et al.
6,875,366 B2 * 4/2005 Sumiya et al. ............... 216/67
(Continued)

FOREIGN PATENT DOCUMENTS

JP 09-074089 A 3/1997
JP 10-232300 * 9/1998
(Continued)

OTHER PUBLICATIONS

PCT International Preliminary Report on Patentability for PCT/JP2011/053142, issued on Aug. 21, 2013.*
(Continued)

*Primary Examiner* — Luz Alejandro Mulero
(74) *Attorney, Agent, or Firm* — Rossi, Kimms & McDowell LLP

(57) ABSTRACT

Provided is an ion exchange resin volume reduction apparatus in which the ignition of plasma is facilitated and the plasma is prevented from extinguishing. A volume reduction apparatus according to aspects of the present invention includes a stage carrying thereon a resin to be treated, a CCP power source, and an ICP power source. The volume reduction apparatus according to a certain aspect of the present invention is provided with a supply mechanism, and the CCP power source continues operating when the resin to be treated is supplied in a depressurized state to a vacuum vessel. In the volume reduction apparatus according to a certain aspect of the present invention, the CCP power source continues operating when a gas condition under which gas is supplied into the vacuum vessel is changed.

10 Claims, 5 Drawing Sheets

(51) Int. Cl.
*G21F 9/30* (2006.01)
*G21F 9/32* (2006.01)
*H01J 37/32* (2006.01)
*H05H 1/46* (2006.01)

(52) U.S. Cl.
CPC ....... *H05H 1/46* (2013.01); *H05H 2001/4667* (2013.01)

(58) Field of Classification Search
CPC ........... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

2004/0050329 A1  3/2004  Ikeda
2006/0175016 A1  8/2006  Edamura et al.
2008/0241419 A1* 10/2008  Chua et al. ................. 427/569

FOREIGN PATENT DOCUMENTS

| JP | 10-232300 A | | 9/1998 |
| JP | 2000-182799 A | | 6/2000 |
| JP | 2000257826 A | | 9/2000 |
| JP | 2000-275393 | * | 10/2000 |
| JP | 2000-275393 A | | 10/2000 |
| JP | 2001059894 A | | 3/2001 |
| JP | 2001-143896 A | | 5/2001 |
| JP | 2001-153998 A | | 6/2001 |
| JP | 2001-305287 | * | 10/2001 |
| JP | 2001-305287 A | | 10/2001 |
| JP | 2002-237486 A | | 8/2002 |
| JP | 2006-216903 A | | 8/2006 |
| KR | 20030039871 A | | 5/2003 |

OTHER PUBLICATIONS

International Search Report for PCT/JP2011/053142. Dated May 24, 2011.
Notification of Reasons for Refusal issued in corresponding Japanese Patent Application No. 2012-557697 dated Jan. 6, 2015. Partial English translation provided.
Office Action issued in Korean Application No. KR10-2013-7021115 mailed May 27, 2016. English translation provided.

* cited by examiner

APPARATUS FOR REDUCING VOLUME OF RESIN CONTAINING RADIOACTIVE MATERIAL, AND METHOD FOR OPERATING THE APPARATUS

CROSS-REFERENCE TO RELATED APPLICATIONS

This application is a continuation of International Application No. PCT/JP2011/053142, filed on Feb. 15, 2011. The disclosure of the PCT application in its entirety, including the drawings, claims, and the specification thereof, are incorporated herein by reference.

TECHNICAL FIELD

The present invention relates to an ion exchange resin volume reduction apparatus and an operation method therefor. More specifically, the present invention relates to an ion exchange resin volume reduction apparatus that reduces the volume of a spent ion exchange resin mainly used in nuclear power facilities and an operation method therefor.

BACKGROUND ART

Methods for increasing the efficiency of volume reduction treatment of low-level radioactive waste products have recently been disclosed. Patent Document 1 (Japanese Patent Application Publication No. 2001-153998) discloses a method for reducing the volume of an ion exchange resin which is a low-lever radioactive waste product discarded from a nuclear power facility by performing carbonization and ashing using oxygen plasma. Patent Document 1 discloses the treatment in which the resin to be treated is placed on a stage inside a vacuum vessel, and the resin located on the stage is subjected to carbonization and ashing by inducing oxygen plasma in the space above the resin.

Further, Patent Document 2 (Japanese Patent Application Publication No. 2000-275393) discloses a volume reduction treatment in which inductively coupled plasma (referred to hereinbelow as "IC plasma") is induced for generating high-density plasma and capacitively coupled plasma is induced after the IC plasma has been stopped to decompose the tar that has adhered to the interior of the vessel.

As disclosed in Patent Document 1 and Patent Document 2, when the resin is treated, IC plasma using a high-frequency power source for generating oxygen plasma is usually used (paragraph [0012] in Patent Document 1 and paragraph [0012] in Patent Document 2). This is because it is desirable to increase the treatment amount per unit time, that is, the treatment speed, in the method for volume reduction treatment of resins, and therefore the IC plasma in which plasma density is easily increased is selected as the oxygen plasma. A power source for inducing the IC plasma is referred to hereinbelow as "ICP power source". The ICP power source is used for initially firing, that is, igniting, the oxygen plasma, and in the conventional volume reduction methods, such as disclosed in Patent Document 1 and Patent Document 2, the ICP power source is also used for maintaining the induced state of oxygen plasma.

Patent Document 1: Japanese Patent Application Publication No. 2001-153998, for example, paragraph [0012].
Patent Document 2: Japanese Patent Application Publication No. 2000-275393, for example, paragraph [0012].

DISCLOSURE OF THE INVENTION

Several problems are associated with the methods for implementing the volume reduction treatment, and measures for resolving such problems have been suggested. The first problem relates to ignition. Thus, oxygen plasma is difficult to ignite as IC plasma. The second problem is that of resistance to changes in gas pressure or gas supply direction. Thus, when the pressure inside the vacuum vessel or the supply direction of the gas supplied into the vacuum vessel for volume reduction treatment is changed, the oxygen plasma induced as IC plasma is easily extinguished. The third problem relates to stability. Thus, the oxygen plasma induced as IC plasma lacks stability and the oxygen plasma can be suddenly extinguished. The below-described measures have been used to resolve those problems.

A method of temporarily reducing the pressure in the vacuum vessel to a level lower than the pressure used during the volume reduction treatment and adjusting the pressure to a higher level after the IC plasma has been ignited under such reduced pressure has been conventionally used for facilitating the ignition of the IC plasma, thereby offering the solution for the first problem relating to the ignition. However, this method does not resolve all of the problems. The aforementioned pressure adjustment is by itself a complex operation of changing the treatment conditions. Thus, this adjustment means that since the pressure suitable for volume reduction treatment is higher than the pressure for igniting the oxygen plasma as IC plasma, the vacuum vessel is degassed to a pressure lower than the pressure suitable for the treatment with the object of merely igniting the plasma. In addition, even after the plasma has been successfully ignited, the pressure should be raised gradually when it is adjusted to a level suitable for the volume reduction treatment. For those reasons, the temporary reduction of pressure performed to ignite the plasma involves operations requiring complex changes of conditions. Furthermore, although the operations performed to change the conditions reduce the probability of the IC plasma being extinguished, such probability is not zeroed.

The second problem associated with the resistance to changes in the pressure inside the vacuum vessel and in the direction of gas supply to the vacuum vessel. This problem arises because the volume reduction treatment is implemented in two phases, namely, a first phase with a relatively low temperature and a second phase with a relatively high temperature, in order to perform the volume reduction treatment with high efficiency. Thus, in order to perform the volume reduction treatment of an ion exchange resin, for example, the first-phase treatment at a relatively low temperature of about 400° C. and a second-phase treatment at a relatively high temperature of about 700° C. are performed in the order of description. The first phase and second phase differ from each other in the pressure suitable for treatment and the direction of the supplied gas. More specifically, it is preferred that the pressure of the first phase and second phase be set such that the pressure of the second phase be higher than that that of the first phase. As for the direction of the supplied gas, where the vacuum vessel is of a cylindrical shape having an axis in the vertical direction, in the first phase of a relatively low temperature, it is preferred that oxygen flow so as to swirl around this axis (swirling flow), whereas in the second phase of a relatively high temperature, it is preferred that the oxygen gas direction be set to a pattern such that the swirling flow pattern be combined with the flow along the axial direction (concentrated flow). When the pressure is changed or the oxygen supply direction is changed, as in the above-described specific example, according to the transition from the first phase to the second phase, where the pressure or the gas supply pattern is changed abruptly, the effect in which the oxygen plasma that has been heretofore induced by the ICP power source is extinguished is sometimes observed. With respect to changes in the pressure, for example, the pressure inside the vacuum vessel has been changed in a stepwise or continuous manner. Concerning the gas supply pattern, for example, a method has been used by which the pattern of the gas supply direction is changed in a stepwise or continuous manner so that the flow rate of the swirling flow be decreased and the flow rate of the concentrated flow be increased, while trying to maintain the total flow rate of the swirling flow and concentrated flow. Although such stepwise or continuous changes of the pressure or gas supply pattern reduce the probability of the IC plasma being extinguished, such changes involve complex operations.

Further, the third problem associated with the stability of plasma manifests itself as sudden extinguishing of plasma occurring when gas is generated from the resin to be treated inside the vacuum vessel. For example, where the resin to be treated is loaded in a state in which the oxygen plasma has been induced by IC plasma, the ignition state of the plasma becomes unstable and the plasma is extinguished. The fact that the resin to be treated includes a certain amount (for example, about 5%) of moisture is related to this effect. Since the resin to be treated is, for example, an ion exchange resin used for purifying water such as cooling water, even when the resin is dried, the moisture is not entirely removed therefrom. Where such resin containing moisture is loaded on a stage heated to a high temperature of, for example, 400° C. inside a depressurized vacuum vessel, a large amount of steam is generated as gas within a short period of time. Therefore, even if the system has been adjusted to conditions under which oxygen plasma can be continuously induced as IC plasma, those conditions are disrupted by the steam and the plasma is difficult to induce continuously and stably. When plasma stability is thus degraded by the steam, it becomes necessary to monitor the plasma state not only to prevent the plasma from extinguishing, but also to reignite the extinguished plasma.

Other measures, for example, the introduction of aid gas such as argon or helium have been also used to facilitate the ignition of plasma or increase the stability of the induced plasma with the object of facilitating the ignition or continuously and stably inducing oxygen plasma as IC plasma in the case in which plasma conditions such pressure and gas direction are changed, or the conditions of the environment into which the resin is loaded are changed. However, where argon gas or helium gas is used in addition to oxygen, it becomes necessary to supply a plurality of various gases for the volume reduction treatment. Therefore, it is desirable to avoid using such aid gases.

The present invention has been created with the object of resolving at least some of the above-described problems. The present invention contributes to the facilitation of treatment of the resin discharged from nuclear power facilities by improving the easiness of ignition of oxygen plasma as IC plasma. The present invention also contributes to the stability of treatment of the resin discharged from nuclear power facilities by the stability of an induced state of oxygen plasma as IC plasma when the pressure is changed or gas supply conditions, such as gas direction, are changed, and when the conditions relating to plasma at the time the resin to be treated is additionally loaded are changed.

The inventors have discovered that the above-described problems can be resolved by applying high-frequency voltage or electric field by capacitive coupling to a space where plasma is to be formed. An ICP power source is usually used, as described hereinabove, for reducing the volume of resin by using oxygen plasma induced inside a vacuum vessel. According to an aspect of the present invention, a power source other than the ICP power source is also used, as necessary, to supply power to the oxygen plasma where the resin is treated. This other power source supplies energy by generating voltage or electric field, that is, by capacitive coupling, to the space where the plasma is ignited or induced. This energy can increase the easiness of plasma ignition (easiness of ignition) and stabilize the induced plasma.

According to one aspect of the present invention, there is provided a volume reduction apparatus, including: a heatable stage that is disposed inside a vacuum vessel and formed to place thereon a resin to be treated which carries a radioactive substance; a CCP power source that supplies a voltage or an electric field by capacitive coupling to a space above the stage inside the vacuum vessel; and an ICP power source that supplies power by inductive coupling to oxygen plasma induced in the space, wherein the CCP power source supplies to the space a voltage or an electric field that ignites the oxygen plasma.

According to another aspect of the present invention, there is provided a volume reduction apparatus including: a heatable stage that is disposed inside a vacuum vessel and formed to place thereon a resin to be treated which carries a radioactive substance; a CCP power source that supplies a voltage or an electric field by capacitive coupling to a space above the stage inside the vacuum vessel; an ICP power source that supplies power by inductive coupling to oxygen plasma induced in the space; and a supply mechanism configured to supply the resin to be treated to the stage while maintaining a depressurized state of the vacuum vessel, wherein the CCP power source supplies the voltage or electric field when the resin to be treated is supplied to the stage by the supply mechanism.

The volume reduction apparatus can perform the treatment such that the resin to be treated is heated and at least either or both of the resin itself and gas released therefrom are oxidized by oxygen plasma.

The CCP power source as referred to herein is provided to supply a voltage or an electric field by capacitive coupling to the space above the stage inside the vacuum vessel. The CCP power source outputs high-frequency power, for example, of a frequency of 13.56 MHz, and this high-frequency power, that is, the CCP power, acts as a voltage or an electric field upon oxygen under a reduced pressure in the space above the stage in the vacuum vessel. The CCP power is used for converting oxygen into plasma and igniting and also for stabilizing the induced oxygen plasma. The ICP power, that is, the output of the ICP power source provided together with the CCP power source in the volume reduction apparatus of the abovementioned aspects, acts so as to increase the density of the oxygen plasma by inductive coupling. Therefore, the action produced by the ICP power on the plasma in this case is based on electromagnetic induction relating to electric charges in the plasma. By contrast, the CCP power outputted by the CCP power source acts to generate a voltage or an electric field in the space and dissociate and ionize the oxygen molecules constituting the plasma.

The expression "when the supply mechanism supplies the resin to be treated" in each of the above-described aspects indicates a point of time at which plasma is easily extinguished when the resin to be treated is supplied in a depressurized state, or a period of time including this point of time. Therefore, the CCP power source acts to supply energy by voltage or electric field to the space above the stage at a point of time at which plasma is easily extinguished when the resin to be treated is supplied, or a period of time including this point of time.

According to yet another aspect of the present invention, there is provided a volume reduction apparatus including: a heatable stage that is disposed inside a vacuum vessel and serves for placing thereon a resin to be treated which carries a radioactive substance; a CCP power source for supplying a voltage or an electric field by capacitive coupling to a space above the stage inside the vacuum vessel; an ICP power source for supplying power by inductive coupling to oxygen plasma induced in the space; and a gas condition control unit for changing a supply condition for gas supplied to the space inside the vacuum vessel from a first gas condition to a second gas condition different from the first gas condition, wherein the CCP power source supplies the voltage or electric field when the supply condition is changed by the gas condition control unit.

In the present aspect, the operation of the ICP power source and the CCP power source is the same as in the above-described aspects. The expression "when the supply condition is changed" in the present aspect indicates a point of time at which plasma is easily extinguished by the change in the gas supply condition, or a period of time including this point of time. In the present aspect, the CCP power source also acts to supply continuously a voltage to the space above the stage through a point of time at which plasma is easily extinguished when the resin to be treated is supplied, or a period of time including this point of time.

The present invention is also implemented in the form of an operation method for a volume reduction apparatus. Thus, according to an aspect of the present invention, there is provided an operation method for a volume reduction apparatus, including: a step of heating a resin to be treated which carries a radioactive substance by a stage which is disposed inside a vacuum vessel and on which the resin to be treated is placed; a step of supplying a voltage or an electric field to a space above the stage inside the vacuum vessel by capacitive coupling; a step of supplying to the space a voltage or an electric field that ignites oxygen plasma from a CCP power source by capacitive coupling; and a step of supplying to oxygen plasma, which has been induced in the space, the power from an ICP power by inductive coupling.

According to another aspect of the present invention, there is provided an operation method for a volume reduction apparatus, including: a step of heating a resin to be treated which carries a radioactive substance with a stage which is disposed inside a vacuum vessel and on which the resin to be treated is placed; a step of supplying a voltage or an electric field to a space above the stage inside the vacuum vessel by capacitive coupling; a step of supplying to oxygen plasma, which has been induced in the space, the power from an ICP power by inductive coupling; a step for supplying power from an ICP power into oxygen plasma, which has been induced in the space, by inductive coupling; and a step for supplying the resin to be treated by a supply mechanism to the stage of the vacuum vessel maintained in a depressurized state, wherein the CCP power source supplies the voltage or electric field when the resin to be treated is supplied to the stage by the supply mechanism.

According to yet another aspect of the present invention, there is provided an operation method for a volume reduction apparatus, including: a step of heating a resin to be treated which carries a radioactive substance with a stage which is disposed inside a vacuum vessel and on which the resin to be treated is placed; a step for supplying a voltage or an electric field to a space above the stage inside the vacuum vessel by capacitive coupling; a step for supplying to oxygen plasma, which has been induced in the space, power from an ICP power by inductive coupling; and a step of changing a supply condition for gas supplied to the space inside the vacuum vessel by a gas condition control unit from a first gas condition to a second gas condition different from the first gas condition, wherein the CCP power source supplies the voltage or electric field when the supply condition is changed by the gas condition control unit.

According to any of the above-described aspects of the present invention, the ignition of plasma is facilitated and stability of the induced plasma can be increased.

BRIEF DESCRIPTION OF THE DRAWINGS

FIG. 5($a$) illustrates at example in which a disk-shaped electrode is disposed in the central section of a high-frequency coil and FIG. 5($b$) illustrates an example in which a ring-shaped electrode is disposed in the outer circumferential section of a high-frequency coil.

BEST MODE FOR CARRYING OUT THE INVENTION

Figure 1:
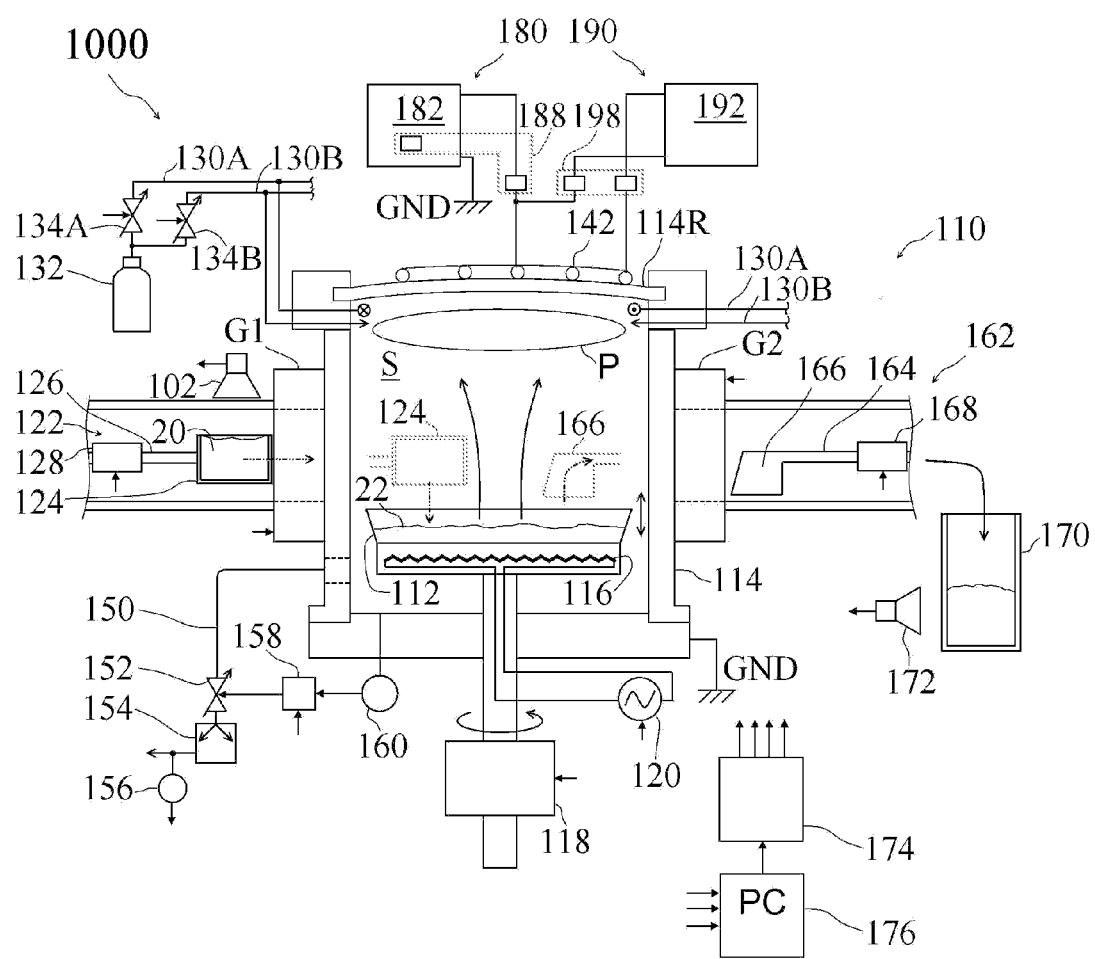
FIG. 1 is a schematic cross-sectional view illustrating the configuration of a volume reduction system including a volume reduction apparatus of the present embodiment.

The embodiments of the present invention are explained below. In the explanation below, the same reference numerals are assigned to the same parts or elements in all of the drawings, unless specifically stated otherwise. The elements of the embodiments in the drawings are not necessarily to scale relative to each other.

<First Embodiment>

1. System Configuration

FIG. 1 is a schematic cross-sectional view illustrating the configuration of a volume reduction system 1000 including a volume reduction apparatus 110 of the present embodiment.

1-1. Configuration of Volume Reduction Apparatus

In the volume reduction apparatus 110 of the volume reduction system 1000, a stage 112 is provided inside a vacuum vessel 114. The stage 112 is configured to carry a supplied resin 20 to be treated which carries a radioactive substance (i.e., a resin to be treated 22). A heater 116 is provided inside the flat section of the stage 112 onto which the resin to be treated 22 is placed, and the temperature of the stage 112 itself can be raised by this heater 116. At lease either the resin 22 heated by the stage 112 or the gas released from the resin 22, or both the resin and the gas are oxidized by oxygen plasma P. A CCP power supply system 180 can be used to ignite the oxygen plasma P. Power (CCP power) supplied from the CCP power supply system 180 generates a voltage or an electric field by capacitive coupling in a space S above the stage 112 inside the vacuum vessel 114. Further, the volume reduction apparatus 110 is also provided with an ICP power supply system 190 for supplying power by inductive coupling to the oxygen plasma P. Furthermore, the volume reduction apparatus 110 is also provided with a supply mechanism 122 configured to supply the resin to be treated to the stage while maintaining the depressurized state of the vacuum vessel.

The CCP power supply system 180 of the volume reduction apparatus 110 can also continuously generate the voltage or electric field in the space S by continuously supplying the CCP power when the resin 20 to be treated is supplied by the supply mechanism 122 onto the stage 112.

A high-frequency coil 142 is disposed on the outer surface (on the atmosphere side) of a top wall 114R of the vacuum vessel 114. The high-frequency coil 142 is used for inducing plasma in the space S on the inner side of the top wall 114R of the vacuum vessel 114.

A degassing line 150 for maintaining the depressurized state inside the vacuum vessel 114 is also connected thereto. A degassing valve 152 and a vacuum pump 154 are connected to the degassing line 150. The opening degree of the degassing valve 152 is controlled by a pressure control unit 158, and the pressure control unit 158 performs continuous control on the basis of a signal of a pressure sensor 160 measuring the pressure in the interior space of the vacuum vessel 114. Therefore, the pressure control unit 158 automatically controls the pressure of the vacuum vessel 114 as an APC (Automatic Pressure Controller).

A carbon dioxide sensor 156 is connected to an outlet-side path of the vacuum pump 154. Concentration data or concentration signals corresponding to the concentration of carbon dioxide that are measured in the degassing path from the vacuum vessel 114 are outputted from the carbon dioxide sensor 156. In the present embodiment, a gas sensor of any type that is capable of attaining the object of measuring the concentration of carbon-containing gas can be used instead of the carbon dioxide sensor 156. For example, the same object can be attained by using a carbon monoxide sensor, rather than the carbon dioxide sensor. Further, the gas sensor such as the carbon dioxide sensor 156 may be installed, for example, at the wall surface of the vacuum vessel 114, or in a path to the vacuum pump 154 in the degassing line 150, rather than in the outlet-side path of the vacuum pump 154.

A radioactivity meter 102 is provided in the volume reduction apparatus 110. The radioactivity meter 102 can be any radioactivity meter configured to measure the radioactivity of the resin 20 to be treated that is supplied to the volume reduction apparatus 110. A semiconductor detector measuring γ radiation by energy resolution is an example of a typical radioactivity meter 102. The radioactivity meter 102 outputs radioactivity data or radioactivity signals representing the value of radioactivity of the resin 20 which is the object of treatment. When the radioactivity meter 102 is configured to have energy resolution of γ radiation, for example, the radioactive nuclides can be specified by the energy of the emitted γ radiation, and the radioactivity of the specified nuclides can be measured. The arrangement position of the radioactivity meter 102 is not limited to that shown in FIG. 1, and the radioactivity meter can be disposed at any position in which the value of radioactivity of the resin 20 which is the object of treatment can be acquired.

1-1-1. Electrode Coil

The high-frequency coil 142 is a twist coil in which, for example, a wire-shaped member made from copper or the like is spirally formed. The high-frequency coil 142 has connection portions at a spiral-shaped central section and a circumferential edge section.

Since power is supplied to the high-frequency coil 142 while supplying oxygen, the induced plasma is mainly oxygen plasma. The top wall 114R of the vacuum vessel 114 is an insulator in order to generate a high-frequency electromagnetic field by the high-frequency coil 142 in the space S. More specifically, the top wall 114R is fabricated from fused quartz glass. The configuration and arrangement of the high-frequency coil that can be used in the present embodiment are not limited to the arrangement of the high-frequency coil 142. For example, the volume reduction treatment of the present embodiment can be implemented by using a high-frequency coil of any shape and arrangement that are suitable for inducing oxygen plasma.

1-2. Power Sources for Plasma

Figure 2:
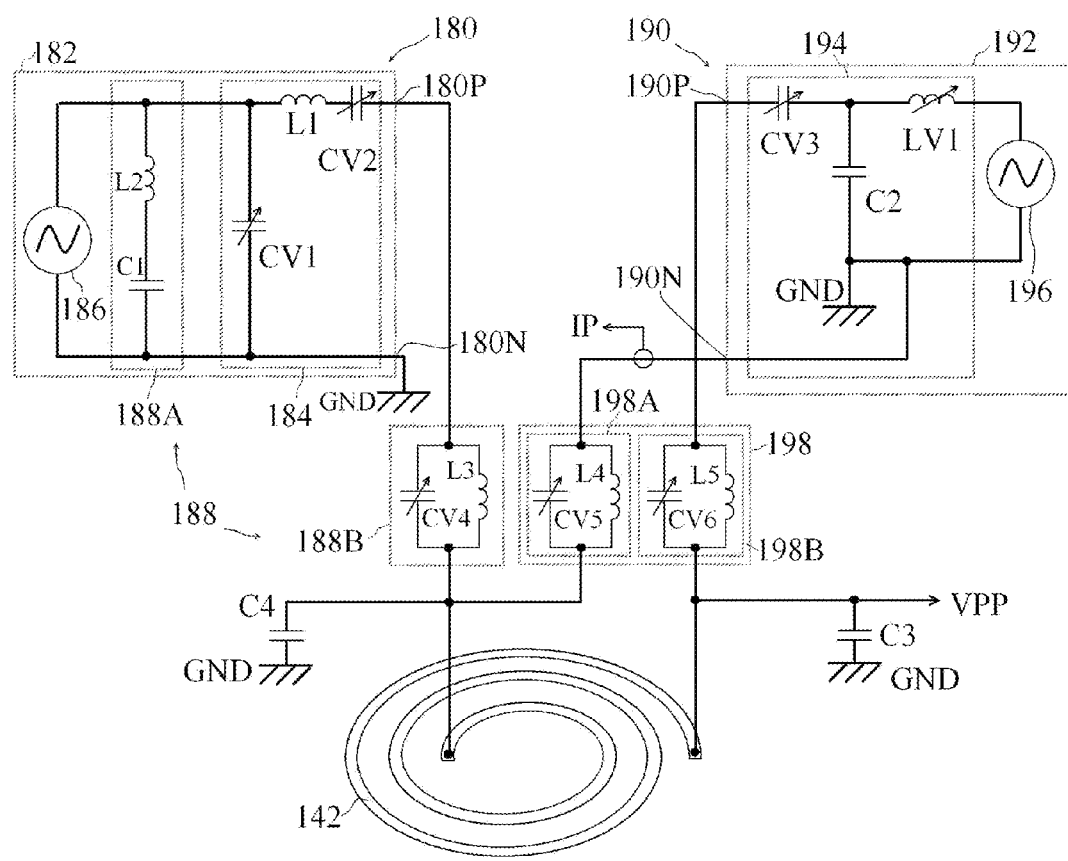
FIG. 2 is a circuit diagram illustrating the configuration of a CCP power supply system and an ICP power supply system in an embodiment of the present invention.

The CCP power supply system 180 and the ICP power supply system 190 are provided in the volume reduction apparatus 110 of the volume reduction system 1000. FIG. 2 is a circuit diagram illustrating the configuration example of the CCP power supply system 180 and the ICP power supply system 190. The CCP power supply system 180 is connected, in combination with an ICP frequency blocking circuit 188 (a serial resonant circuit 188A and a parallel resonant circuit 188B), to the high-frequency coil 142, and the ICP power supply system 190 is connected, in combination with an CCP frequency blocking circuit 198 (a parallel resonant circuit 198A and a parallel resonant circuit 198B), to the high-frequency coil 142.

1-2-1. CCP Power Source

The CCP power supply system 180 is provided, for example, with a CCP high-frequency power source 186 which is a high-frequency power source of the frequency for CCP which is 13.56 MHz, and a CCP matching circuit 184 for matching the output of the high-frequency power source with the high-frequency coil 142. Among the two outputs of the CCP power supply system 180, one CCP output 180P is connected through the parallel resonant circuit 188B of the ICP frequency blocking circuit 188 to the high-frequency coil 142. By contrast, the other CCP output 180N is connected to GND. Since the vacuum vessel 114 is also connected to GND and maintained at a ground-level potential (FIG. 1), the output of the CCP power supply circuit 180 provides a voltage or an electric field to the space S between the high-frequency coil 142 and the vacuum vessel 114 through the top wall 114R. In other words, the high-frequency coil 142 forms a capacitor creating an electric field in the space S between the coil and the electrically conductive member that is at an electric potential equal to that of the vacuum vessel 114, and the voltage or electric field created by the CCP power acts to facilitate the ignition of plasma when the plasma is ignited and improve the stability of the induced plasma.

The CCP matching circuit 184 is provided with variable capacitors CV1 and CV2 and a reactance L1. For example, by varying the capacity of the variable capacitors CV1 and CV2 as a circuit constant in the CCP matching circuit 184, it is possible to transfer efficiently the current output of the CCP high-frequency power source 186 to the high-frequency coil 142.

The ICP frequency blocking circuit 188 is constituted by the serial resonant circuit 188A and the parallel resonant circuit 188B. In the serial resonant circuit 188A, a capacitor C1 and a reactance L2 are connected in serial. In the parallel resonant circuit 188B, a variable capacitor CV4 and a reactance L3 are connected in parallel. The serial resonant circuit 188A acts to short circuit the electric current of the ICP frequency component, that is, a 2 MHz frequency component by serial resonance, whereas the parallel resonant circuit 188B acts to block the passage of the electric current with the ICP frequency component (2 MHz) by parallel resonance. Therefore, the ICP frequency blocking circuit 188 including the serial resonant circuit 188A and the parallel resonant circuit 188B attenuates and blocks the power of the ICP frequency component, for example 2 MHz, transferred from the ICP power supply system 190 to the CCP power source 182 or CCP power supply system 180. The ICP frequency blocking circuit 188 substantially does not act upon the CCP power of the ICP frequency, for example, 13.56 MHz. In other words, with respect to the CCP power, likewise, the serial resonant circuit 188A is an open circuit and the parallel resonant circuit 188B is a short circuit. The blocking frequency of the parallel resonant circuit 188B is adjusted by changing the capacity of the variable capacitor CV4. Since the reactance L2 and the reactance L3 are actual reactance elements, they have a parasitic resistance, and the energy of the 2 MHz power, which is in the resonance state, is dissipated as Joule heat by this parasitic resistance. The ICP frequency blocking circuit 188 thus attenuates the power of the ICP frequency component transferred from the ICP power supply system 190 to the CCP power supply system 180.

1-2-2. ICP Power Source

The ICP power supply system 190 is provided, for example, with an ICP high-frequency power source 196 which is a high-frequency power source of the ICP frequency which is 2 MHz, and an ICP matching circuit 194 for matching the output of the high-frequency power source with the high-frequency coil 142. Among the two outputs of the ICP power supply system 190, one ICP output 190P and the other ICP output 190N are connected through the parallel resonant circuits 198A and 198B included in the CCP frequency blocking circuit 198 to two respective terminal sections of the high-frequency coil 142. The output of the ICP power supply system 190 generates a high-frequency electromagnetic field in the space S between the high-frequency coil 142 and the vacuum vessel 114 through the top wall 114R.

The ICP matching circuit 194 is provided with a variable capacitor CV3, a capacitor C2, and a variable reactance LV1. In the ICP matching circuit 194, for example, the capacity of the variable reactance LV1 is adjusted for matching by which the current output of the ICP high-frequency power source 196 is efficiently transferred to the high-frequency coil 142.

The CCP frequency blocking circuit 198 is provided with the parallel resonant circuit 198A connected to the ICP output 190P, and the parallel resonant circuit 198B connected to the ICP output 190N. The parallel resonant circuit 198A is a parallel resonant filter for attenuating the power of the CCP frequency produced by a variable capacitor CV5 and a reactance L4, for example, a 13.56 MHz component. Likewise, the parallel resonant circuit 198B is a parallel resonant filter for attenuating the power of the CCP frequency produced by a variable capacitor CV6 and a reactance L5. The blocking frequencies of the parallel resonant circuit 198A and the parallel resonant circuit 198B are adjusted by changing the capacities of the variable capacitor CV4 and the variable capacitor CV5. The reactances L4 and L5 carry parasitic resistances. Therefore, similarly to the case of the ICP frequency blocking circuit 188, the energy of the power of the CCP frequency (13.56 MHz) blocked by the parallel resonant circuit 198A and the parallel resonant circuit 198B is dissipated as Joule heat by the reactances L4 and L5. The CCP frequency blocking circuit 198 thus attenuates the power transferred from the CCP power supply system 180 to the ICP power supply system 190. The ICP power substantially does not act upon the CCP frequency blocking circuit 198. In other words, for example, the two parallel resonant circuits 198A and 198B act as short circuits with respect to the ICP power of an ICP frequency, for example, 2 MHz.

1-2-3. Connection and Operation of CCP Power Source and ICP Power Source

As described hereinabove, in the volume reduction apparatus 110 of the present embodiment, both the CCP power supply system 180 and the ICP power supply system 190 are connected to the high-frequency coil 142. Therefore, the high-frequency coil 142 acts, in one operation thereof, as an electrode for capacitively coupling the high-frequency power with a frequency of 13.56 MHz from the CCP power supply system 180 with the space S (FIG. 1) between the coil and the grounded vacuum vessel 114. The high-frequency coil 142 in this case becomes an electrode for the grounded vacuum vessel 114, and a voltage or an electric field is generated in the space S by capacitive coupling. The CCP power supply system 180 acts to increase the easiness of plasma ignition and stability of the induced plasma in the space by capacitive coupling created by the voltage or electric field. The capacitors C3 and C4 shown in FIG. 2 are provided to measure the voltage on the high-frequency coil 142 by causing the high-frequency coil 142 to float above the ground GND. Thus, where the peak-to-peak voltage amplitude VPP, with respect to the ground GND, of the electrode opposite to the grounded electrode of the capacitor C3 for floating is monitored, the voltage of the output created by the CCP power supply system 180 makes it possible to measure an indication of the voltage applied by the electrode of the high-frequency coil 142 to the space.

Further, in another operation of the high-frequency coil 142, an electric current created by the 2 MHz high-frequency power from the ICP power supply system 190 flows through the coil and an electric field and a magnetic field are generated in the space S. This action of the high-frequency coil 142 is based on inductive coupling with the plasma serving as a conductor generated in this space. The ICP power supply system 190 acts to supply the power for increasing the density of plasma to the space S by inductive coupling. A current measuring terminal is provided at the ICP output 190N. The indicator of the output current of the ICP power supply system 190 can be obtained by measuring the peak current IP from this terminal.

1-2-4. Functions of Blocking Circuits

As mentioned hereinabove, the ICP frequency blocking circuit 188 is connected to the CCP power supply system 180, and the CCP frequency blocking circuit 198 is connected to the ICP power supply system 190. Those blocking circuits function to reduce the effect produced on the power source by the power of the other power source. In other words, the ICP frequency blocking circuit 188 prevents the CCP high-frequency power source 186 from being damaged and the matching ensured by the CCP matching circuit 184 from being lost under the effect of the power from the ICP power supply system 190. Likewise, the CCP frequency blocking circuit 198 prevents the ICP high-frequency power source 196 from being damaged and the matching ensured by the ICP matching circuit 194 from being lost under the effect of the power from the CCP power supply system 180.

1-3. Supply Mechanism

The typical volume reduction apparatus 110 (FIG. 1) of the present embodiment is provided with the supply mechanism 122. The resin 20 to be treated is supplied by the supply mechanism 122 to the stage 112 through a supply-side gate valve G1. In order to perform this supply operation, the supply mechanism 122 is provided with a metering cylinder 124 fabricated to a predetermined volume. In order to supply the resin 20 to be treated, initially, the metering cylinder 124 is moved by an arm 126 to a position in a space above the stage 112 through the opened supply-side gate valve G1. Then, the metering cylinder 124 is rotated at this position about the axis of the arm 126, whereby the resin 20 to be treated that is located inside the metering cylinder 124 is dropped on the upper surface of the stage 112. A metering cylinder drive mechanism 128 enabling such an operation is connected to the arm 126.

1-4. Control of Gas Supply Conditions

The volume reduction apparatus 110 is provided with the vacuum vessel 114 fabricated in a substantially cylindrical shape. Gas supply lines 130A and 130B for supplying oxygen into the inner space of the vacuum vessel 114 are connected to the vacuum vessel 114. From the gas supply lines 130A and 130B, oxygen from the oxygen cylinder 132 is supplied at a controlled flow rate into the inner space of the vacuum vessel 114 through regulator valves 134A and 134B, respectively. Therefore, at least the regulator valves 134A and 134B operate as gas condition control units that control the supply conditions of oxygen supplied into the inner space of the vacuum vessel 114. In the volume reduction system 1000 including the volume reduction apparatus 110 of the present embodiment, the regulator valves 134A and 134B can be calibrated so as to be controlled by a computer 176 via a direct or sequential control unit 174. In this case, the computer 176 or the sequential control unit 174 also operates as the gas condition control unit.

1-5. Other Components

The stage 112 is a metallic tray fabricated in a round plate-like shape and configured such that the resin 22 to be treated can be placed on the upper surface of the tray. The stage 112 is also configured to be rotatable about the axis perpendicular to the flat section and passing through the center of the round plate, while maintaining the gas-tight state of the vacuum vessel 114. A stage drive mechanism 118 makes it possible to rotate the stage 112 slowly at a rate, for example, from one revolution per several minutes to several revolutions per minute. Further, the stage 112 is fabricated such that the position thereof in the vertical direction, that is, the height, in FIG. 1 can be changed. A heating power source 120 that supplies the controlled power to the heater 116 is connected to the stage 112. A temperature sensor (not shown in the figure) that measures the temperature of the stage 112 is provided at the stage 112 for temperature control. The power supplied to the heater 116 is controlled according to the temperature measurement signal from the temperature sensor. The temperature of the stage 112 can be controlled to a temperature suitable for volume reduction treatment, for example, 400° C. or 700° C., but those temperatures are not particularly limiting.

In addition to the above-described control, the computer 176 can also control the start and stop of the degassing operation of the vacuum vessel 114, change the pressure command values used by the pressure control unit 158 in automatic control, start, regulate the output or stop the heating power source 120, and control the drive command of the discharge mechanism 162. For this purpose, the computer 176 receives data or signals from the volume reduction apparatus 110, radioactivity meter 102, carbon dioxide sensor 156, and additional radioactivity meter 172.

2. Treatment Operations

Figure 3:
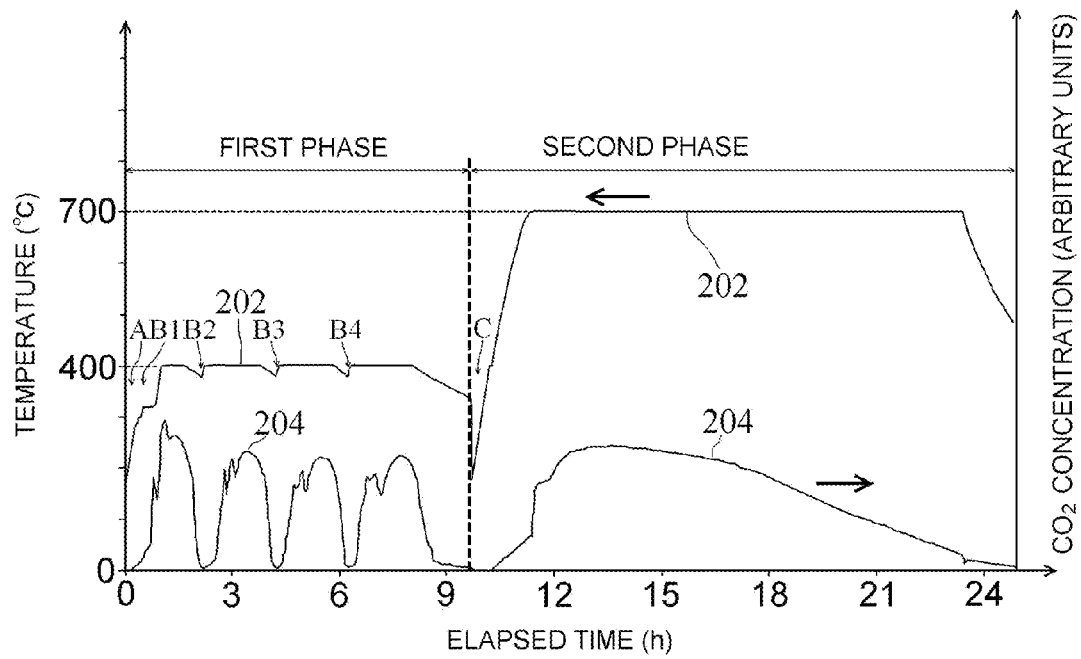
FIG. 3 is a graph (FIG. 3($a$)) of indicators (temperature and carbon dioxide concentration) indicating the state of the volume reduction system and a graph (FIG. 3($b$)) of estimated weight reduction ratio illustrating how the resin volume is reduced in an embodiment of the present invention.
Figure 3:
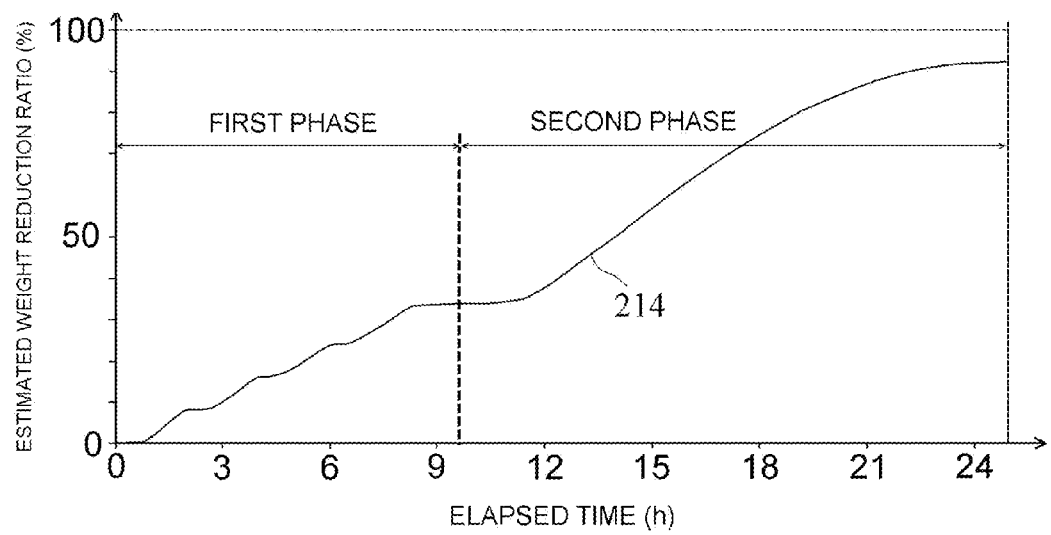

The operations of the volume reduction apparatus 110 of the above-described volume reduction system 1000 will be explained below. FIG. 3 is an explanatory drawing (FIG. 3(*a*)) of indicators indicating the state of the volume reduction system 1000 and an explanatory drawing (FIG. 3(*b*)) of the estimated weight reduction ratio illustrating how the resin volume is reduced. The temperature (curve 202) of the stage 112 and the value (curve 204) of carbon dioxide concentration obtained from the carbon dioxide sensor 156 are shown in FIG. 3(*a*) as the indicators of the state of the volume reduction system 1000. The estimated weight reduction ratio (curve 214) illustrating how the resin volume is reduced is shown in FIG. 3(*b*).

The temperature of the stage 112 shown by the curve 202 is the temperature indicated value shown by a temperature sensor provided at the stage 112 which is not shown in the figure; the numerical value of the temperature is plotted against the ordinate. Meanwhile, the curve 204 indicating the value of carbon dioxide concentration outputted by the carbon dioxide sensor 156 represents only the variations in time and the scale of values is in arbitrary units. However, the values of carbon dioxide concentration shown by the curve 204 are plotted linearly, and the abscissa is drawn such that the concentration is zero thereon. The abscissa in FIG. 3 represents the time counted from the instant the initial sub-batch (first sub-batch) of the resin 22 to be treated is placed on the stage 112 and the supply-side gate valve G1 is closed, that is, the treatment time. The entire treatment shown in FIG. 3(*a*) requires a time of about 24 h. The sub-batch, as referred to herein, is a treatment unit obtained by further subdividing the batch of the resin 20 that is the unit treatment amount of volume reduction treatment.

2-1. Entire Operation and Summary

As shown in FIG. 3(*a*), the volume reduction treatment performed by the volume reduction system 1000 is generally divided into two treatment phases, that is, the first phase (first treatment) and the second phase (second treatment). In the first phase, the stage 112 is heated to about 400° C., whereas in the second phase, the stage 112 is heated to about 700° C. Incidentally, those temperatures demonstrate finer temporal fluctuations, as shown in the curve 202. For example, when the treatment object in the volume reduction system 1000 is an ion exchange resin used in nuclear power generating facilitates, the resin 22 to be treated is a mixture of the ion exchange resin, a radioactive substance carried by the ion exchange resin, and the residual moisture. The ion exchange resin used in nuclear power generating facilities carries the radioactive substances including radioactive isotopes in the form of ions or corrosive products (clads) that are adsorbed or held thereby.

The essence of treatment in each phase is explained below. In the first phase, the resin 22 to be treated is loaded into the vacuum vessel 114 by dividing into several sub-batches, and placed on the stage 112. In the first phase, the resin 22 to be treated is carbonized by heating to a temperature of about 400° C. This is the very first treatment to which the resin 22 is subjected. Each sub-batch of the resin 22 to be treated is placed on the stage 112, and where the heating is started, a large amount of water vapor is released before a temperature of about 400° C. is reached. Where the temperature then rises close to 400° C., the resin 22 also starts releasing a large amount of decomposition gas. The release of the decomposition gas is similar to the release of decomposition gases by typical organic compounds under heating. In this state, power for inducing the plasma P is introduced to the high-frequency coil 142. This power is a combination of high-frequency power with a frequency of 13.56 MHz for capacitive coupling which is supplied by the CCP power supply system 180 and high-frequency power with a frequency of 2 MHz for inductive coupling which is supplied by the ICP power supply system 190.

The decomposition gas released from the resin 22 is oxidized by the oxygen plasma P induced in the space above the stage 112, and an easily oxidizable component contained in the decomposition gas, for example, a carbon component, is oxidized. The gas generated by the oxidation of the decomposition gas by the oxygen plasma P, that is, the treatment gas, includes carbon dioxide or carbon monoxide. This treatment gas is discharged through the degassing line 150. The decomposition in the treatment proceeds rapidly immediately after the treatment has been started and then starts relaxing once a certain time elapses. This result corresponds to the consumption of the component that is decomposed under the effect of temperature. The carbonization product of the decomposition gas component extracted from the resin 22 remains on the stage 112. Even if this carbonized resin 22 is sufficiently treated in the first phase, the treatment still advances only to the carbonized state. Therefore, at this point of time, the carbon component remains in the resin 22. Thus, in the first phase, the decomposition of the resin 22, carbonization, and oxidation of the decomposition gas are executed by a combination of heating of the stage 112 and oxidation by the oxygen plasma P.

The carbon component of the decomposition gas in the first phase is discharged from the degassing line 150 in the form of carbon dioxide or carbon monoxide present in the oxidized treatment gas, and the concentration thereof is measured by the carbon dioxide sensor 156. The concentration of carbon dioxide in the first phase rises with the increase in temperature in each sub-batch, and a high value thereof is maintained for a certain time, but then decreases with the consumption of the component that is decomposed. This value of the carbon dioxide concentration is a direct indicator of the amount of carbon oxidized per unit time in the resin 22. In addition, this value of carbon dioxide concentration is also an indirect indicator of the total amount of oxidizable components in the resin 22 to be treated. In addition to the carbon component, the oxidizable components of the resin 22 to be treated include nitrogen components, sulfur components, and hydrogen components.

In the first phase, the resin 22 is treated in sub-batches as treatment units that are obtained by dividing the resin 22 according to the treatment capacity range of the volume reduction apparatus 110. FIG. 2(*a*) illustrates the case in which the resin 22 to be treated is loaded upon division into four sub-batches. In the first phase, the advancement of heating-induced carbonization and decomposition treatment of the first sub-batch of the resin 22 to be treated is monitored as the value of carbon dioxide concentration. Where it is determined on the basis of the value of carbon dioxide concentration that the treatment of the first sub-batch has advanced to a certain level, the supply-side gate valve G1 is opened and the next sub-batch, that is, the resin 22 of the second sub-batch, is additionally loaded. At this time, the resin 22 that has been treated to a certain level as the first sub-batch still remains on the stage 112. The resin 22 of the second sub-batch is additionally supplied on the stage 112 in such a state. Therefore, both the second sub-batch of the resin 22 that has been loaded anew and the first sub-batch that is being treated are treated together. The treatment is thereafter similarly performed with respect to the third sub-batch and fourth sub-batch. The first phase of treatment of the resin 22 is thus advanced by small portions because the amount of decomposition gas generated from the resin 22 in the first phase is larger than in the treatment of the second phase and the capacity for treating the decomposition gas is limited.

The second phase is explained below. During the transition from the first phase to the second phase, the vacuum vessel 114 is not opened to the atmosphere and remains depressurized. However, the pressure, that is, the degree of vacuum changes from the first phase to the second phase. The object of treatment in the second stage is a semi-processed product carbonized by the treatment of the first phase in the form of the first to fourth sub-batches of the resin 22 remaining on the stage 112. In the description below, this semi-processed product will be also referred to as the resin 22 to be treated. In the second phase, the temperature of the stage 112 in this state is raised to 700° C. Where the temperature of the resin 22 carbonized by the treatment of the first phase rises, the oxygen plasma acts upon the carbonized resin 22 and the carbon component is oxidized and removed. Thus, in the treatment of the second phase the volume is further reduced by decreasing the amount of the carbon component in the carbonized resin 22 by ashing that includes a combination of heating and oxygen plasma treatment. The oxygen plasma P is used in the second phase in the same manner as in the first phase. Therefore, power for inducing the plasma P by inductive coupling is supplied to the high-frequency coil 142. However, in the first phase, the oxidation of the decomposition gas is an expected action of the oxygen plasma P, whereas in the second phase, the induced oxygen plasma P is expected to ash the carbonized resin 22. Because of such a difference in the expected action, the gas supply condition, from among the conditions (plasma conditions) for inducing the oxygen plasma P, typically differs among the first phase and second phase. In a most typical example, a pressure, which is the gas supply condition, is selected to be higher in the second phase than in the first phase. The oxygen supply direction is also selected such that the gas flow from the top wall 114R toward the stage 112 is stronger in the second phase than in the first phase.

Where the resin 22 to be treated is subjected to ashing through the second phase, the carbon component remaining in the resin 22 is converted into the treatment gas such as carbon dioxide or carbon monoxide and discharged from the degassing line 150. The concentration of carbon dioxide in the second phase also rises with the increase in temperature and the high value thereof is maintained for a certain time, but then decreases following the consumption of the oxidized component. In the second phase, similarly to the first phase, the value of carbon dioxide concentration obtained with the carbon dioxide sensor 156 also directly indicates the amount of carbon per unit time that is oxidized in the resin 22 and indirectly indicates the total amount of oxidizable components in the resin 22.

The supplied resin 20 to be treated (resin 22 to be treated) is subjected to the volume reduction treatment while being located on the stage 112. The volume reduction treatment is performed by heating by the stage 112 and oxidizing with the oxygen plasma P. Thus, in the volume reduction apparatus 110, the resin 22 to be treated is heated, and at least either or both of the resin 22 itself and the gas released from the resin 22 is oxidized by the oxygen plasma P. Where the volume reduction treatment is performed in the second phase, a solid matter (residual solid matter) located on the stage 112 is obtained from the resin 22.

Where the second phase is completed, the CCP power supply system 180 and the ICP power supply system 190 are stopped, plasma induction is stopped, and stage heating is also stopped, thereby stopping the volume reduction treatment. After the treatment has been completed, the residual solid matter is removed by the discharge mechanism 162 from the stage 112 and discharged to the outside of the vacuum vessel 114. A suction pipe 164 provided with a recovery nozzle 166 is disposed in the discharge mechanism 162. The suction pipe 164 is connected to a discharge drive mechanism 168 for driving the recovery nozzle 166 in a state in which the discharge-side gate valve G2 is open to the position suitable for suction of the residual solid matter located on the stage 112. The residual solid matter sucked in by the suction pipe 164 is recovered, while preventing scattering in a bag filter or cyclone (none is shown in the figure) for recovering the residual solid matter from the gas flow and temporarily stored in the residual solid matter container 170. The residual solid matter container 170 is provided with an additional radioactivity meter 172 for measuring radioactivity remaining in the final residual solid matter. The residual solid matter of the residual solid matter container 170 is then, for example, sealed with cement or covered with sand to increase safety, transported to an appropriate facility, for example, final disposal site, and disposed in semi-permanent storage.

Each of the above-described treatment steps is indicated by a computer 176 directly or via the sequence control unit 174. Finally, the radioactivity of the treated residual solid matter is measured, as necessary, by the additional radioactivity meter 172.

The operations in which the CCP power supply system 180 and the ICP power supply system 190 are used at the same time when the volume reduction apparatus 110 of the present embodiment is operated will be explained below in greater detail.

2-2. Plasma Ignition and Induction

In order to realize the entire above-described process, plasma should be ignited in the volume reduction apparatus 110 when the first phase is started. Further, the induced state of the plasma should be stabilized in order to prevent the induced plasma from extinguishing. The operations performed by the CCP power supply system 180 and the ICP power supply system 190 used in the present embodiment will be explained below in relation to the aforementioned operations.

2-2-1. Action of CCP Power Source

First, the action of the CCP power supply system 180 considered by the inventor of the present application will be explained. As mentioned hereinabove the CCP power supply system 180 operates to generate a voltage or an electric field in the space S inside the vacuum vessel 114 by capacitive coupling. This voltage or electric field demonstrates an ignition facilitating effect by which the ignition of oxygen plasma is facilitated. The voltage or electric field also demonstrates an extinguishing preventing effect by which the induced oxygen plasma is prevented from extinguishing. More specifically, where the voltage or electric field is generated in the space S, oxygen which is in the depressurized state is easily dissociated and ionized. Therefore, oxygen easily forms plasma. The depressurized state mentioned herein may correspond to a pressure such that is sufficient for the below-described depressurization treatment, for example, a pressure of about 10 Torr. In other words, where the CCP power supply system 180 is actuated, it is not necessary to reduce the pressure in the vacuum vessel 114 with the object of facilitating the ignition of plasma. Where the CCP power supply system 180 is not used and the plasma is ignited only by the ICP power supply system 190, a similar voltage, that is, electric field, cannot be generated by the same power. Further, the pressure range in which such apparatuses usually operate is a range on the left side of the minimum value of the Paschen's curve, that is, a range in which the voltage or electric field required for the electric discharge increases with the increase in pressure. For those reasons, when only the ICP power supply system 190 is used, a lower pressure is required to ignite the oxygen plasma easily. Further, the voltage or electric field created by the CCP power supply system 180 in the space S also acts to prevent the plasma from extinguishing.

2-2-2. Action of ICP Power Source

The action the ICP power supply system 190 is explained below. The ICP power supply system 190 acts to increase the density of the oxygen plasma P. Since the oxygen plasma P of a high density is generated by electromagnetic induction in the vicinity of the high-frequency coil 142, that is, immediately below the top wall 114R, by the power from the ICP power supply system 190, the amount of treatment per unit time in the volume reduction treatment, that is, the treatment speed, can be increased.

2-2-3. Effect Demonstrated by Simultaneous Use of CCP Power Source and ICP Power Source Where the CCP power supply system 180 and the ICP power supply system 190 are actuated at the same time, the power (CCP power) from the CCP power supply system 180 and the power (ICP power) from the ICP power supply system 190 are inputted to the high-frequency coil 142 in superposition on each other. As a result, a state is eventually created in which the voltage or electric field produced by the CCP power and the electromagnetic induction produced by the ICP power act simultaneously on the space S. In the conventional configuration in which the IC plasma induced only by inductive coupling is generated in the space S, the ICP power acts to densify the plasma. However, such increase in density is achieved by inductive coupling of the ICP power and the electric conductivity demonstrated by the dissociated ions in the plasma. Conversely, in a state in which the plasma is extinguished or not ignited, the increase in the ICP power only results in the increased electric current in the high-frequency coil 142. By contrast, where the CCP power is inputted in superposition on the ICP power, as in the present embodiment, the dissociation action is also produced on the oxygen modules that have not been converted into plasma. Therefore, where the CCP power is superimposed on the ICP power, the ignition of oxygen plasma is facilitated and the plasma that has been ignited is prevented from extinguishing.

2-2-3-1. Plasma Ignition Operation

The timing for igniting plasma is the timing indicated by a time A in FIG. 3(a), that is, the timing at which the treatment of the first phase is started. This timing is explained below in greater detail. The very first treatment included in the volume reduction treatment involves measuring the initial radioactivity by the radioactivity meter 102. Then, the supply-side gate vale G1 is opened, the resin 22 of the sub-batch that is the very first to be loaded (first sub-batch) is supplied, and the supply-side gate valve G1 is again closed. In this treatment, a predetermined volume of the resin 22 to be treated is supplied by the metering cylinder 124, and the resin 22 is placed in advance as a first sub-batch on the stage 112 of the vacuum vessel 114. Then, the interior of the vacuum vessel 114 is depressurized. For example, a pressure of about 10 Torr (1.3 kPa) is selected as a pressure suitable for the volume reduction treatment of the first phase. Where the target pressure is reached, the stage 112 is heated to 400° C. by the heater 116 to start volume reduction treatment in the first phase. The carbon dioxide sensor 156 then starts measuring the concentration of carbon dioxide. The order of the stage heating and carbon dioxide measurement can be reversed. The plasma is then ignited. In the volume reduction apparatus 110 of the present embodiment, the plasma can be ignited while automatically controlling the pressure to a value suitable for the above-described treatment of the first phase.

More specifically, when the plasma is ignited, first, the supply of power of the CCP frequency such as 13.56 MHz (CCP power) to the high-frequency coil 142 is started by the CCP power supply system 180. In this case, the power acts to oscillate the voltage of the high-frequency coil 142 with respect to the grounded conductive parts, such as the vacuum vessel 114 and the stage 112. This voltage acts as an electric field on the space S, and converts the introduced oxygen into plasma. The oxygen plasma is thus ignited. The output of the CCP power supply system 180 that is necessary for the ignition is, for example, about 1 kW. In the volume reduction apparatus 110 of the present embodiment, the operation of reducing the pressure to below the pressure suitable for the volume reduction treatment and then returning the pressure to a level suitable for the volume reduction treatment, as in the conventional volume reduction apparatus, is not required. The ICP power is then outputted from the ICP power supply system 190 in order to supply the power by inductive coupling, this power serving to increase the density of plasma. The output of the CCP power from the CCP power supply system 180 is then increased, for example, to about 2 kW to stabilize further the induction state of plasma. The output of the ICP power from the ICP power supply system 190 can be at any level.

2-2-3-2. Stabilization of Plasma During First-Phase Resin Loading

Where the treatment is started, the concentration of carbon dioxide gas changes as shown by the curve 204 in FIG. 3(a). After the time A, the first sub-batch of the supplied resin 22 is treated. Where this treatment is started, the concentration of carbon dioxide gas increases steadily and then, after reaching the maximum value, the concentration starts decreasing. At a time B1 which corresponds to the increase in the concentration of carbon dioxide gas, a large amount of moisture (not shown in the figure) is released as water vapor from the first sub-batch of the supplied resin 22 to be treated, and this moisture adversely affects the stability of the induced oxygen plasma P. In the present embodiment, the CCP power is also outputted at this time from CCP power supply system 180 and a voltage or an electric field is generated in the space S. At the same time, the ICP power from the ICP power supply system 190 acts upon the scape S. Thus, even if the moisture released from the first sub-batch of the supplied resin 22 to be treated is present, the high-density oxygen plasma can be stabilized and the plasma state can be maintained.

This operation performed at the time B1 is also similarly performed when the second sub-batch, third sub-batch, and then fourth sub-batch of the resin 20 to be treated are additionally loaded. Those timings are shown as time B2, B3, and B4 in FIG. 3(a). The CCP power is also outputted from the CCP power supply system 180 and, at the same time, the ICP power is also outputted from the ICP power supply system 190 at those timings at which the resin 20 to be treated is additionally loaded, thereby making it possible to stabilize and continuously induce the high-density oxygen plasma.

When the second to fourth sub-batches are loaded, the supply-side gate valve G1 is opened to load each sub-batch of the resin 20, and then the supply-side gate valve G1 is closed again. Since both sides of the supply-side gate valve G1 are degassed, the pressure in the vacuum vessel 114 is not changed even when the supply-side gate valve G1 is opened.

When the treatment in the volume reduction apparatus 110 is performed, the output of the carbon dioxide sensor 156 is monitored. For example, the measured value of the concentration of carbon dioxide gas is determined to be at a maximum and the monitoring is conducted till the measured value drops to about 90% of the maximum value. Where it is determined that the measured value has dropped from the maximum value thereof, for example, when the measured value becomes less than 90%, the resin of the sub-batch next to that of the sub-batch that is being treated is additionally loaded. In the operation of the volume reduction apparatus 110 of the present embodiment, the output of the CCP power produced by the CCP power supply system 180 can be also controlled according to the advancement of the treatment based on the output of the carbon dioxide sensor 156 that is thus monitored. This can be done so because it is experimentally confirmed that the period of time in which water vapor is generated after the additional sub-batch has been loaded is a certain period of time after the loading of the additional sub-batch. When such control is performed, the output of the CCP power produced by the CCP power supply system 180 is started before the point of time at which the additional sub-batch is loaded and continued within a predetermined period of time determined by tests. When such predetermined period of time elapses, the output of the CCP power produced by the CCP power supply system 180 is stopped.

When the same treatment is performed with respect to all of the sub-batches, the treatment of the first phase is completed.

2-3. Change of Gas Supply Condition in Transition to the Second Phase

Where the treatment of the first phase is completed, a state is assumed in which the carbonized product of the supplied resin 22 is disposed on the stage 112. In the volume reduction apparatus 110 of the present embodiment, the treatment of ashing the carbonized product is performed as the treatment of the second phase. For this purpose, first, the temperature of the stage is raised to 700° C. Then, the gas supply condition is changed from that of the first phase to match the treatment conditions of the second phase. This change of gas supply condition includes changing the conditions, such as changing the pressure, inside the vacuum vessel 114, and changing the flow rate or supply direction of oxygen gas. The gas supply condition can include any condition relating to gas, from among plasma conditions, that affects the stability of plasma.

2-3-1. Change of Pressure

In the present embodiment, the pressure inside the vacuum vessel 114 is included in the gas supply condition that is changed between the first phase and the second phase. This is because, the pressure suitable for the volume reduction treatment in the first phase differs from that in the second phase. In the present embodiment, the pressure of the first phase is set, for example, to about 10 Torr (1.3 kPa). By contrast, the pressure of the second phase is set, for example, to 30 Torr to 50 Torr (about 4.0 kPa to 6.7 kPa).

Where the pressure is rapidly changed in such a case in which the pressure of the first phase is different from that of the second phase, with the conventional method in which oxygen plasma is induced only by the ICP power, the plasma is highly probable to be extinguished. In order to prevent the plasma from being extinguished by such pressure change, the pressure has been conventionally changed in a stepwise manner or continuously from that in the first phase to that in the second phase. By contrast, in the present embodiment, at the timing at which the pressure of the first phase is changed to that of the second phase, the output of the CCP power produced by the CCP power supply system 180 is used together with the output of the ICP power produced by the ICP power supply system 190. By so using the combined action of the CCP power and the ICP power, it is possible to maintain stably the induced state of plasma even when the pressure is changed abruptly. The output of the CCP power supply system 180 that is necessary therefor is, for example, about 1 kW. The pressure in the vacuum vessel 114 is controlled by changing the pressure command value by which the pressure control unit 158 performs the automatic control as APC.

2-3-2. Change of Gas Supply Pattern

Figure 4:
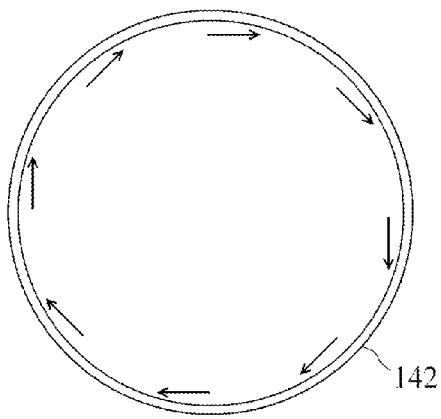
FIG. 4 is an explanatory drawing explaining the swirling flow (FIG. 4($a$)), concentrated flow (FIG. 4($b$)), first-phase gas flow (FIG. 4($c$)), and second-phase gas flow (FIG. 4($d$)) by a horizontal cross sectional view of the vacuum vessel in an embodiment of the present invention.
Figure 4:
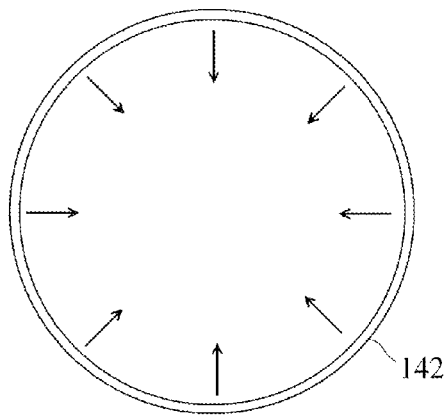
Figure 4:
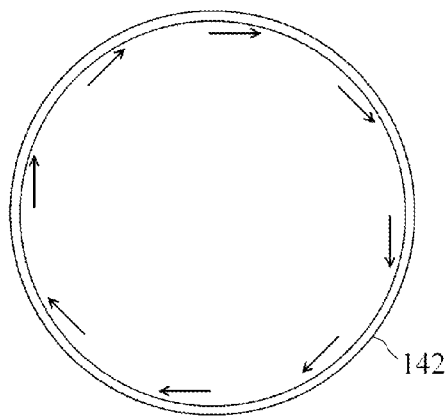
Figure 4:
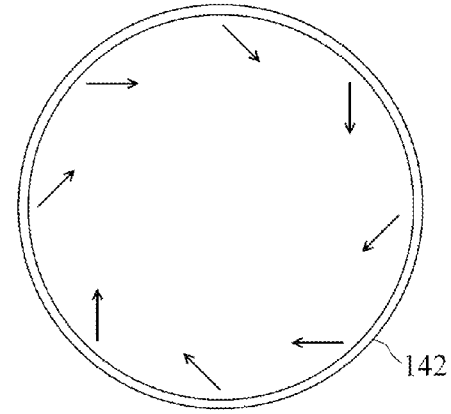

In the gas supply conditions in the first phase and second phase, the patterns of supply direction of oxygen gas differ from each other. In other words, in the first phase, oxygen is mainly supplied by a swirling flow pattern, whereas in the second phase, oxygen is supplied in a pattern in which the swirling flow component is combined with a concentrated flow component that is concentrated toward the axis. In the vacuum vessel 114 fabricated to have a cylindrical shape coaxial with the central axis of the stage 112, the swirling flow as referred to herein essentially has the direction substantially along the surface including the stage 112 along the inner wall of the cylinder, such that vortexes of oxygen gas are generated in the cylindrical space S. The flow component concentrated toward the axis, as referred to herein, is a component from the inner wall of the vacuum vessel 114 toward the axis of the stage 112. FIG. 4 is an explanatory drawing in which the swirling flow (FIG. 4(*a*)) and concentrated flow (FIG. 4(*b*)), the gas flow in the first phase (first pattern, FIG. 4(*c*)), and the gas flow in the second phase (second pattern, FIG. 4(*d*)) are explained in the horizontal sectional view of the vacuum vessel 114. In order to introduce those gases, several gas introducing ports are provided in the inner wall of the vacuum vessel 114 in the direction ensuring unidirectional rotation along the circumference for forming the swirling flow and in the direction toward the axis for forming the concentrated flow. In FIG. 1, the direction of gas introduction from the gas supply line 130A is drawn toward the paper sheet surface at the left inner side surface of the vacuum vessel 114 and from the paper sheet surface at the right inner side surface of the vacuum vessel 114. The direction of gas introduction from the gas supply line 130B is drawn from the inner surface of the vacuum vessel 114 toward the center. Further, the flow rate in respective gas introducing ports is realized by adjusting the opening/closing state and flow rate in the regulator valve 134A for the swirling flow and the regulator valve 134B for the concentrated flow, those valves being included in the gas supply line 130A or 130B.

The reason for supplying the oxygen gas according to those patterns is described below. In the first phase, the treatment of oxidizing the decomposition gas released from the supplied resin 22 is the main volume reduction treatment. Therefore, in the oxygen plasma for the first phase, the treatment is performed for oxidizing the decomposition gas at a maximum possible efficiency. For this purpose, it is necessary to increase the amount of oxygen gas flowing toward the space S over that flowing toward the supplied resin 22 that is located on the stage 112. Therefore, the swirling flow is selected for the oxygen gas in the first phase (FIG. 4(*c*)). By contrast, in the second phase a state is assumed in which the supplied resin 22 has been carbonized, and the treatment of ashing the carbonized residual solid matter is the main treatment. Therefore, it is necessary to supply efficiently the oxygen activated by the oxygen plasma toward the supplied resin 22. This is so because the ashing is difficult to advance by merely continuously applying the heat from the stage 112 to the carbonized residual solid matter, and the direction is preferred such that the activated oxygen gas necessary for the ashing is "blasted". Where a pattern such that includes the concentrated flow component is used, oxygen is supplied to the space above the stage 112, the activated oxygen is supplied from the oxygen plasma as a downward flow toward the supplied resin 22 to be treated, and carbon-containing gas, such as carbon dioxide, generated from the supplied resin 22 is removed at the same time. Therefore, the gas flow (FIG. 4(*d*)) in which the concentrated flow is combined with the swirling flow is supplied to attain this object. The swirling flow component is left in the pattern of the second phase because where oxygen at a low rate suitable for the volume reduction treatment is supplied only by the concentrated flow, the downward flow becomes too strong. In other words, where the swirling flow is combined with the concentrated flow, the appropriate downward flow is realized while supplying the oxygen at a flow rate suitable for the volume reduction treatment. The ratio of the concentrated flow and swirling flow is adjusted to set the oxygen supply pattern in the above-described manner.

As described above, in the case in which oxygen plasma is induced as IC plasma by the output of the power source for ICP created only by the ICP power supply system 190, where the oxygen supply pattern is changed abruptly, the oxygen plasma induced as IC plasma can be extinguished. Further, the possibility of the plasma being extinguished cannot be completely eliminated by performing the conventional treatment in which the oxygen supply pattern is changed continuously or in a stepwise manner. In the present embodiment, since the output of CCP power from the CCP power supply system 180 is also used in addition to the output of the ICP power source from the ICP power supply system 190, the possibility of the plasma being extinguished at the timing at which the direction of oxygen supply is changed can be reduced. Therefore, it is not necessary to change the oxygen supply direction continuously or in a stepwise manner as in the conventional configurations. For example, the induced state of plasma can be stably maintained even if the oxygen supply pattern is changed abruptly from the swirling flow pattern suitable for the first phase to the combination pattern of swirling flow and concentrated flow suitable for the second phase.

2-4. Option: Simultaneous Use During Stationary Operation

In the above-described embodiment, the CCP power is outputted from the CCP power supply system 180 at any one or all of the timing of plasma ignition, timing of additional loading of the resin to be treated in the first phase, and timing of transition from the first phase to the second phase. The CCP power from the CCP power supply system 180 outputted at any of those timings acts as a voltage or an electric field upon the space S and demonstrates the effect of facilitating the ignition of plasma and preventing the plasma from extinguishing. The option of actuating the CCP power supply system 180 by selecting, as appropriate, some or all of those timings, as necessary, is included in the present embodiment.

In the present embodiment, the operation mode such that the CCP power is continuously outputted from the CCP power supply system 180 can be also selected at random. One effect of such selection is that the oxygen plasma can be effectively prevented from being suddenly extinguished, in the same manner as in the above-described operation mode in which the output is performed at each timing. Another effect is that the treatment speed can be increased over that in the case in which only the ICP power source from the ICP power supply system 190 is outputted. This effect of increasing the treatment speed has been conventionally associated with the restriction placed on the oxygen flow rate in the configuration using only the IC plasma. Where the output of CCP power from the CCP power supply system 180 of the present embodiment is used, plasma stability is increased and, therefore, the volume reduction apparatus 110 can be operated by an increased oxygen flow rate which was difficult to use in the conventional configurations. As a result, the rate of oxidation of the decomposition gas or oxidation of the residual solid matter of the supplied resin 22 can be increased and the treatment rate in the volume reduction apparatus 110 can be increased.

The timing of outputting the CCP power from the CCP power supply system 180 at which such effects can be expected is any timing at which the treatment of the first phase and second phase is performed. For example, the CCP power from the CCP power supply system 180 is outputted in some of the periods of time from among any period of time from the time B1 to the time B2 shown in FIG. 3(a), any period of time from the time B2 to the time B3, and any period of time from the time B3 to time B4, or in all those periods of time. Where the CCP power is outputted from the CCP power supply system 180 in any of those periods of time, the treatment speed during oxidation of the decomposition gas in the first phase can be increased. Further, as another period of time, the CCP power from the CCP power supply system 180 can be also effectively outputted at any timing after a time C. Where the CCP power is outputted from the CCP power supply system 180 in any period after the time C, the treatment speed during oxidation of the residual solid matter of the supplied resin 22 in the second phase can be increased.

EXAMPLE

An example of the volume reduction apparatus 110 that can be operated according to the above-described embodiment was fabricated. More specifically, the CCP power supply system 180 and the ICP power supply system 190 shown in FIG. 2 were fabricated by using circuit components shown in Table 1.

TABLE 1

| Element or block | Structural Component | Circuit constant or the like | Note |
|---|---|---|---|
| High-frequency coil 142 | High-frequency coil | | Water-cooled |
| CCP high-frequency power source 186 | High-frequency power source | 13.56 MHz, maximum output 5 kW | |

TABLE 1-continued

| Element or block | Structural Component | Circuit constant or the like | Note |
|---|---|---|---|
| CCP matching circuit 184 | Variable capacitor CV1 | 100 pF to 1600 pF | |
| | Variable capacitor CV2 | 50 pF to 370 pF | |
| | Reactance L1 | 2.08 µH | |
| Serial resonant circuit 188A | Capacitor C1 | 2000 pF | |
| | Reactance L2 | 3.8 µH | |
| Parallel resonant circuit 188B | Variable capacitor CV4 | 100 pF to 1000 pF | |
| | Reactance L3 | 8.5 µH | |
| ICP high-frequency power source 196 | High-frequency power source | 2 MHz, maximum output 5 kW | |
| ICP matching circuit 194 | Capacitor C2 | 2500 pF | |
| | Variable capacitor CV3 | 1700 pF to 3700 pF | |
| | Variable reactance LV1 | 35 µH to 55 µH | |
| Parallel resonant circuit 198A | Variable capacitor CV5 | 12 pF to 500 pF | |
| | Reactance L4 | 0.5 µH | Water-cooled |
| Parallel resonant circuit 198B | Variable capacitor CV6 | 12 pF to 500 pF | |
| | Reactance L4 | 1.2 µH | Water-cooled |
| | Capacitor C3 | 1000 pF | |
| | Capacitor C4 | 50 pF | |

As for the circuit constants of the structural components presented in Table 1, the actual components include those combined, rather than used individually, to conform to the necessary circuit constants. For example, the capacitor C2 (2500 pF) used in the ICP matching circuit 194 can be mounted according to the combined capacitance realized by connecting in parallel two 1000 pF capacitors and one 500 pF capacitor.

The easiness of ignition of the oxygen plasma P in the volume reduction apparatus 110 and the stability of the induced oxygen plasma P were actually evaluated using the CCP power supply system 180 and the ICP power supply system 190 fabricated in the above-described manner. As a result, the oxygen plasma P could be ignited easier than in the case in which only the ICP power supply system 190 was used, and the CCP power supply system 180 was not used. More specifically, it was necessary to reduce the pressure in the vacuum vessel 114 for ignition, and the oxygen plasma P could be ignited by setting the 13.56 MHz output, which was outputted from the CCP power supply system 180 to the high-frequency coil 142 to about 1 kW, while maintaining the pressure at 10 Torr (1.3 kPa). When the output from the CCP power supply system 180 was then increased to about 2 kW to obtain higher stability and the 2 MHz output, which was outputted from the ICP power supply system 190 to the high-frequency coil 142 was raised to about 3 kW and maintained at this level, it was possible to perform the volume reduction treatment by generating high-density plasma. This plasma could be easily ignited at the time A of the first phase (FIG. 3) and also could be stably induced, without being extinguished, at any of the times B1, B2, B3, and B4.

When a transition was made from the first phase to the second phase, the pressure in the vacuum vessel 114 was raised to 50 Torr (about 6.7 kPa) and the flow pattern was changed from the swirling flow to a combination of swirling flow and concentrated flow by regulating the regulator valve 134A and the regulator valve 134B. The induced plasma was not extinguished even at the time C and stable plasma could be continuously induced.

First Embodiment: Variation Example

Figure 5:
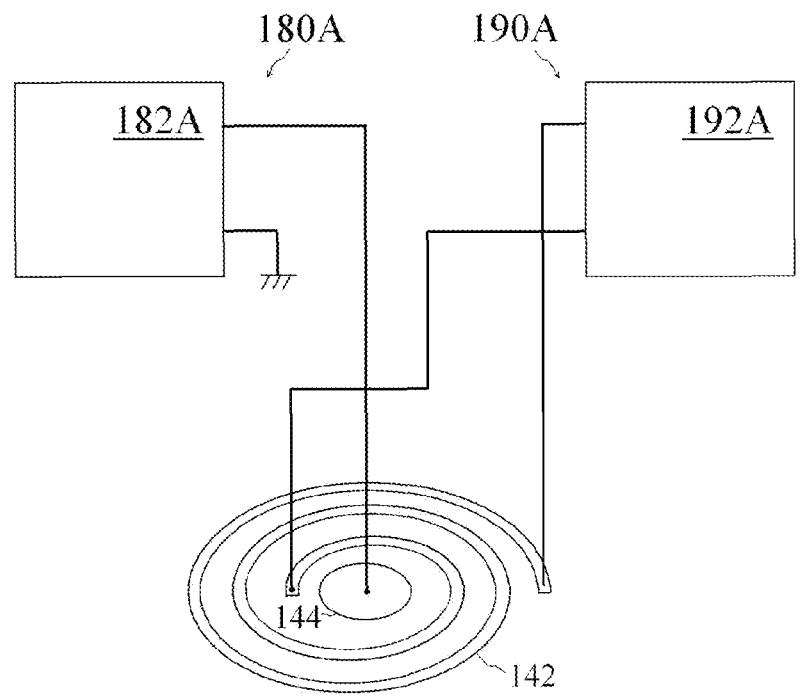
FIG. 5 is an explanatory drawing illustrating the configuration of a plurality of electrodes arranged at the atmosphere-side surface of the top wall and how the CCP power supply system and the ICP power supply system corresponding thereto are connected.
Figure 5:
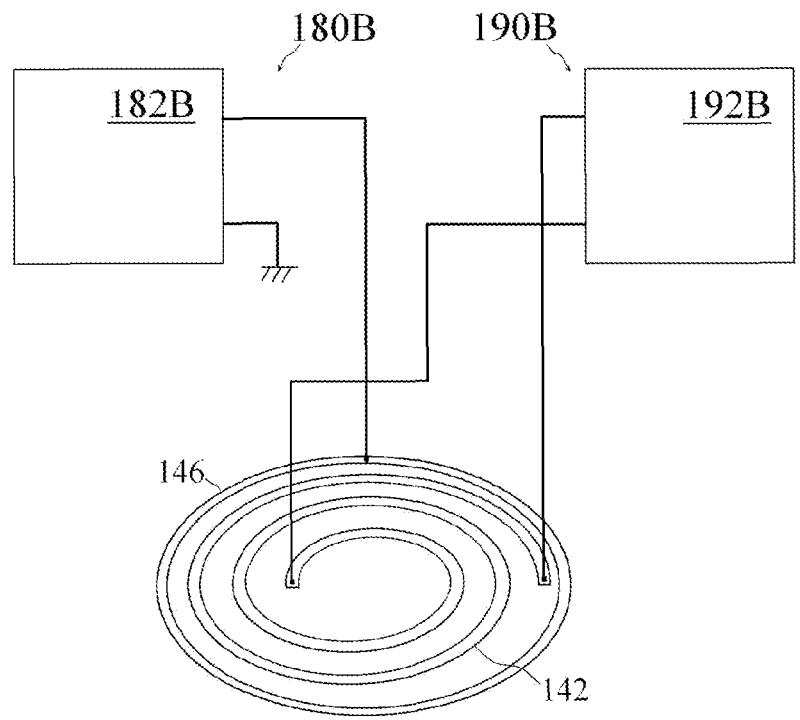

The above-described first embodiment of the present invention can be variously changed without departing from the essence thereof. In particular, with a voltage or an electric field being generated in the space S by capacitive coupling, a configuration can be used in which the output of the CCP power from the CCP power supply system 180 is caused to act upon the space S (FIG. 1) through an electrode separate from the high-frequency coil 142. FIG. 5 is an explanatory drawing illustrating the configuration of a plurality of electrodes arranged at the atmosphere-side surface of the top wall 114R of the vacuum vessel 114 and how the CCP power supply system and the ICP power supply system corresponding thereto are connected. FIG. 5(*a*) illustrates at example in which a disk-shaped electrode 144 is disposed in the central section of the high-frequency coil 142 connected to an ICP power supply system 190A, and the CCP power from a CCP power supply system 180A is outputted to the disk-shaped electrode 144. Further, FIG. 5(*b*) illustrates an example in which a ring-shaped electrode 146 is disposed in the outer circumferential section of the high-frequency coil 142 connected to an ICP power supply system 190B, and the CCP power from a CCP power supply system 180B is outputted to the ring-shaped electrode 146.

In the cases shown in FIGS. 5(*a*) and 5(*b*), the action increasing the plasma density in the space S is demonstrated due to the electric current flowing as the output of the ICP power supply systems 190A and 1908 and the ICP power sources 192A and 1928 in the high-frequency coil 142. In those cases, since the high-frequency coil 142 is used only for inductively coupling the ICP power to the space S, the coil acts only as an ICP coil. In the case in which the disk electrode 144 shown in FIG. 5(*a*) is used, the output of the CCP power from the CCP power source 182A of the CCP power supply system 180A acts as a voltage or an electric field upon the space S between the disk electrode 144 and the vacuum vessel 114, and the action facilitating the ignition of plasma and the action stabilizing the plasma are demonstrated. Further, when the ring electrode 146 shown in FIG. 5(*b*) is used, the output of the CCP power from the CCP power source 1828 of the CCP power supply system 1808 also acts as a voltage or an electric field upon the space S between the ring electrode 146 and the vacuum vessel 114, and the action facilitating the ignition of plasma and the action stabilizing the plasma are demonstrated. Since the vacuum vessel 114 is also grounded (GND) and maintained at the ground-level potential (FIG. 1), the disk electrode 144 or the ring electrode 146 acts as a capacitor creating an electric field in the space S between itself and the electrically conductive member that is at the electric potential equal to that of the vacuum vessel 114.

As shown in FIG. 5, when the CCP power from the CCP power supply system 180A or 180B is outputted to the electrode separate from the high-frequency coil 142, the output of the CCP power supply system 180A or 180B and the output of the ICP power supply system 190A or 190B are directly connected to each other. When an electrode separate from the high-frequency coil 142 is thus used, the effect produced by the CCP power source 182A or 182B and the ICP power source 192A or 192B upon each other can be reduced for certain specific configurations of the high-frequency coil 142 and the disk electrode 144, or the high-frequency coil 142 and the ring electrode 146. In such a case, the ICP frequency blocking circuit 188 or the CCP frequency blocking circuit 198 shown in FIG. 2 is omitted or the configuration thereof is simplified. However, for certain specific configurations of the high-frequency coil 142 and the disk electrode 144, or the high-frequency coil 142 and the ring electrode 146, the effect produced by the CCP power source 182A or 182B and the ICP power source 192A or 192B upon each other can still be a problem. In such a case, a blocking circuit is installed that blocks the mutual frequency components, this circuit being similar to the ICP frequency blocking circuit 188 or the CCP frequency blocking circuit 198 shown in FIG. 2.

In the example shown in FIG. 5, a variation example is described in which only one of the disk electrode 144 and the ring electrode 146 is used. Which of those electrodes to use can be selected, as appropriate, with consideration, for example, for the intensity of the electric field generated in the space S or the intensity of the CCP power supplied to the plasma. Further, the configuration in which both the disk electrode 144 and the ring electrode 146 are provided and the CCP power is supplied thereto and the configuration in which an electrode of some other form is provided at another position such that an electric field is generated in the space S and the CCP power is supplied to this electrode are also included in the present embodiment.

The embodiments of the present invention are explained hereinabove in detail. The above-described embodiments and examples are presented to describe the present invention, and the scope of the invention of the present application should be determined on the basis of the claims. Variation examples within the scope of the present invention that include other combinations of the embodiments are also included in the claims.

INDUSTRIAL APPLICABILITY

The present invention provides a volume reduction apparatus suitable for stable treatment of resins, and an operation method therefor, thereby facilitating the volume reduction treatment of wastes discarded from operating nuclear power facilities.

FIG. 3(*a*)
FIRST PHASE
SECOND PHASE
TEMPERATURE (° C.)
$CO_2$ CONCENTRATION (ARBITRARY UNITS)
ELAPSED TIME (h)
FIG. 3(*b*)
FIRST PHASE
SECOND PHASE
ESTIMATED WEIGHT REDUCTION RATIO (%)
ELAPSED TIME (h)

The invention claimed is:

1. A volume reduction apparatus, comprising:
  a heatable stage that is disposed inside a vacuum vessel and formed to place thereon a resin to be treated which carries a radioactive substance;
  a CCP power source that supplies a voltage or an electric field by capacitive coupling to a space above the stage inside the vacuum vessel;
  an ICP power source that supplies power by inductive coupling to oxygen plasma induced in the space;
  a coil connected at least to the ICP power source;
  a supply mechanism configured to supply the resin to be treated to the stage while maintaining a depressurized state of the vacuum vessel; and
  a computer or a sequential control unit configured to control the CCP power source and the ICP power source, wherein the CCP power source and the ICP power source are provided separately from each other, and the computer or the sequential control unit is configured such that when a voltage or an electric field that ignites the oxygen plasma is to be supplied to the space, the voltage or electric field is simultaneously supplied from the CCP power source and the ICP power source, and thereafter, the voltage or electric field is supplied from the CCP power source also when the resin to be treated is additionally supplied to the stage by the supply mechanism, to prevent plasma extinction.

2. The volume reduction apparatus according to claim 1, wherein
the resin to be treated includes moisture, and the resin to be treated that has been supplied to the stage by the supply mechanism releases water vapor.

3. The volume reduction apparatus according to claim 1, wherein the coil is disposed at a position directly or indirectly facing, with an insulating wall of the vacuum vessel interposed, the space above the stage inside the vacuum vessel and is also connected to the CCP power source.

4. The volume reduction apparatus according to claim 3, wherein
the coil is also electrically connected to an output of the CCP power source;
the ICP power source outputs power for ICP frequency, and a CCP frequency blocking circuit that blocks an output from the CCP power source is connected to the ICP power source; and
the CCP power source outputs power for CCP frequency, and an ICP frequency blocking circuit that blocks an output from the ICP power source is connected to the CCP power source.

5. The volume reduction apparatus according to claim 1, wherein the coil is disposed at a position directly or indirectly facing, with an insulating wall of the vacuum vessel interposed, the space above the stage inside the vacuum vessel and is connected to the ICP power source; the volume reduction apparatus further comprising:
a CCP electrode that is disposed at a position of either a central section surrounded by the ICP coil or a peripheral section surrounding the ICP coil and that is connected to the CCP power source.

6. The volume reduction apparatus according to claim 1, wherein the computer or a sequential control unit configured such that the voltage or electric field is supplied from only the CCP power source when the resin to be treated is additionally supplied to the stage by the supply mechanism.

7. A volume reduction apparatus, comprising:
a heatable stage that is disposed inside a vacuum vessel and formed to place thereon a resin to be treated which carries a radioactive substance;
a CCP power source that supplies a voltage or an electric field by capacitive coupling to a space above the stage inside the vacuum vessel;
an ICP power source that supplies power by inductive coupling to oxygen plasma induced in the space;
a coil electrically connected at least to the ICP power source;
a gas condition control unit that changes a supply condition for gas supplied to the space inside the vacuum vessel from a first gas condition to a second gas condition different from the first gas condition; and
a computer or a sequential control unit configured to control the CCP power source and the ICP power source, wherein
the CCP power source and the ICP power source are provided separately from each other, and
the computer or the sequential control unit is configured such that when a voltage or an electric field that ignites the oxygen plasma is to be supplied to the space, the voltage or electric field is simultaneously supplied from the CCP power source and the ICP power source, and thereafter the voltage or electric field is supplied from the CCP power source also when the supply condition is changed by the gas condition control unit, to prevent plasma extinction.

8. The volume reduction apparatus according to claim 7, wherein the coil is disposed at a position directly or indirectly facing, with an insulating wall of the vacuum vessel interposed, the space above the stage inside the vacuum vessel and is also connected to the CCP power source.

9. The volume reduction apparatus according to claim 8, wherein
the coil is also electrically connected to an output of the CCP power source;
the ICP power source outputs power for ICP frequency, and a CCP frequency blocking circuit that blocks an output from the CCP power source is connected to the ICP power source; and
the CCP power source outputs power for CCP frequency, and an ICP frequency blocking circuit that blocks an output from the ICP power source is connected to the CCP power source.

10. The volume reduction apparatus according to claim 7, wherein the coil is disposed at a position directly or indirectly facing, with an insulating wall of the vacuum vessel interposed, the space above the stage inside the vacuum vessel and is connected to the ICP power source; the volume reduction apparatus further comprising:
a CCP electrode that is disposed at a position of either a central section surrounded by the ICP coil or a peripheral section surrounding the ICP coil and that is connected to the CCP power source.

* * * * *